United States Patent
Kim et al.

(10) Patent No.: US 11,476,069 B2
(45) Date of Patent: Oct. 18, 2022

(54) LOW NOISE RELAY

(71) Applicants: Hyundai Motor Company, Seoul (KR); Kia Motors Corporation, Seoul (KR)

(72) Inventors: Jong Joo Kim, Suwon-si (KR); Su Mi Son, Suwon-si (KR); In Sic Kim, Incheon (KR); Jong Hyuk Jung, Suwon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 454 days.

(21) Appl. No.: 16/601,060

(22) Filed: Oct. 14, 2019

(65) Prior Publication Data
US 2020/0395181 A1  Dec. 17, 2020

(30) Foreign Application Priority Data
Jun. 14, 2019 (KR) .................. 10-2019-0070612

(51) Int. Cl.
| | | |
|---|---|---|
| H01H 13/04 | (2006.01) | |
| H01H 50/14 | (2006.01) | |
| H05K 1/18 | (2006.01) | |
| H01H 50/30 | (2006.01) | |
| H01R 12/58 | (2011.01) | |

(52) U.S. Cl.
CPC .......... H01H 50/14 (2013.01); H01H 50/305 (2013.01); H05K 1/184 (2013.01); *H01R 12/58* (2013.01); *H05K 2201/10053* (2013.01); *H05K 2201/10787* (2013.01)

(58) Field of Classification Search
CPC ...... H01H 50/14; H01H 50/305; H01H 50/02; H01H 50/16; H01H 50/30; H01H 1/50; H01H 3/60; H01H 2221/062; H05K 1/184; H05K 2201/10053; H05K 2201/10787; H01R 12/58
USPC ......................................................... 335/202
See application file for complete search history.

(56) References Cited

U.S. PATENT DOCUMENTS

| | | | | |
|---|---|---|---|---|
| 3,315,054 A  * | 4/1967 | Langley | ............... | H01H 83/223 |
| | | | | 337/72 |
| 5,949,313 A | 9/1999 | Aoki et al. | | |
| 6,018,689 A  * | 1/2000 | Kumura | .................. | F16F 15/02 |
| | | | | 702/56 |
| 6,043,653 A  * | 3/2000 | Takamori | ........... | G01R 33/3854 |
| | | | | 324/309 |
| 6,798,322 B2 * | 9/2004 | Copper | ................ | H01H 50/305 |
| | | | | 335/193 |
| 10,325,741 B2 * | 6/2019 | Liang | ................... | H01H 50/047 |
| 2001/0030882 A1* | 10/2001 | Pitzele | .................. | H05K 7/142 |
| | | | | 363/147 |

(Continued)

*Primary Examiner* — Shawki S Ismail
*Assistant Examiner* — Lisa N Homza
(74) *Attorney, Agent, or Firm* — Slater Matsil, LLP

(57) ABSTRACT

A low noise relay includes a main body part provided with a terminal on a first surface thereof. A cover part is coupled to the terminal and the first surface of the main body part. The cover part is electrically connected to the terminal of the main body part. A vibration reduction part is connected and electrically coupled to the cover part. The vibration reduction part is configured to support the main body part to be suspended in air. A pin part is configured such that a first side of the pin part is connected with and electrically connected to the vibration reduction part.

15 Claims, 3 Drawing Sheets

(56) References Cited

U.S. PATENT DOCUMENTS

| | | | |
|---|---|---|---|
| 2003/0231090 A1* | 12/2003 | Copper | H01H 50/305 335/128 |
| 2007/0057514 A1* | 3/2007 | Mukai | H02K 16/00 290/40 C |
| 2010/0207713 A1* | 8/2010 | Sugisawa | H01H 50/54 335/201 |
| 2012/0293285 A1* | 11/2012 | Kurihara | H01H 50/047 335/202 |
| 2017/0229270 A1* | 8/2017 | Liang | H01H 50/047 |

* cited by examiner

LOW NOISE RELAY

CROSS-REFERENCE TO RELATED APPLICATIONS

This application claims priority to Korean Patent Application No. 10-2019-0070612, filed on Jun. 14, 2019, which application is hereby incorporated herein by reference.

TECHNICAL FIELD

The present invention relates generally to a relay.

BACKGROUND

Generally, various electric parts of a vehicle include a wiring harness, various units, and a relay for controlling on/off operation of electric parts.

The relay is fundamentally provided with an electromagnet for generating the operating force of the relay, and the operating element operated by the electromagnet is configured to connect and disconnect electrical contacts provided inside the relay.

However, there is a problem that noise and vibration occur due to the movement of the operating element operated by the electromagnet when the relay operates. Therefore, it is necessary to develop a technique that can reduce the operating noise of the relay.

The foregoing is intended merely to aid in the understanding of the background of the present invention, and is not intended to mean that the present invention falls within the purview of the related art that is already known to those skilled in the art.

SUMMARY

The present invention relates generally to a relay. In particular embodiments of the invention relate to a low noise relay, in which the structure and shape of the relay is improved to reduce the operating noise of the relay. Embodiments of the present invention can solve problems occurring in the related art.

According to one aspect of the present invention, a low noise relay includes a main body part provided with at least one terminal on a first surface thereof. At least one cover part is coupled to the terminal and the first surface of the main body part and is configured such that a signal is transmitted from the main body part via the terminal. At least one vibration reduction part is connected to the cover part such that the signal transmitted from the main body part is transmitted and is configured to support the main body part to be suspended in air and to reduce vibration transmitted from the main body part. At least one pin part is configured such that a first side thereof is connected with the vibration reduction part and a second side thereof is connected with a printed circuit board, thereby transmitting the signal transmitted from the main body part to the printed circuit board.

The terminal may be provided on an upper surface of the main body part, and may protrude in a direction opposite to a position of the printed circuit board.

The cover part may be made of a conductive material, and may include an upper cover part covering an upper surface of the main body part, and a side cover part extending downward from an end of the upper cover part to cover a side surface of the main body part.

The upper cover part may be formed with a hole to be engaged with the terminal, and the upper cover part may be provided with an embossed protruding portion on a lower surface thereof.

The main body part may be provided with a groove on the upper surface thereof, and the protruding portion may be engaged with the groove.

A height of the protruding portion may be greater than a depth of the groove.

The upper cover part may be spaced apart from the upper surface of the main body part by a difference between the height of the protruding portion and the depth of the groove while being coupled to the main body part as the hole is engaged with the terminal.

The vibration reduction part may be made of a flexible conductive material, and may be configured such that a first side thereof is coupled to the cover part and a second side thereof is coupled to the pin part, thereby transmitting the signal transmitted from the main body part to the printed circuit board.

The vibration reduction part may be formed in a flat plate shape by orthogonally crossing wires of flexible conductive material with each other.

The relay may further include a terminal cover part configured to insulate the terminal while covering the terminal provided on the first surface of the main body part.

The relay may further include a shock absorber part provided between the main body part and the printed circuit board, and configured to absorb operating noise and vibration of the main body part.

The main body part and the cover part, the cover part and the vibration reduction part, and the vibration reduction part and the pin part may be fixed to each other by soldering.

The relay may further include a base part disposed at a lower portion of the shock absorber part, provided with a hole through which the pin part passes, and coupled to the printed circuit board.

According to the present invention, by improving the structure and shape of the relay, it is possible to reduce the operating noise of the relay, thereby alleviating noise introduced into the passenger compartment to improve the quietness of the vehicle.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF ILLUSTRATIVE EMBODIMENTS

Hereinbelow, a low noise relay according to an exemplary embodiment of the present invention will be described in detail with reference to the accompanying drawings.

Figure 1:
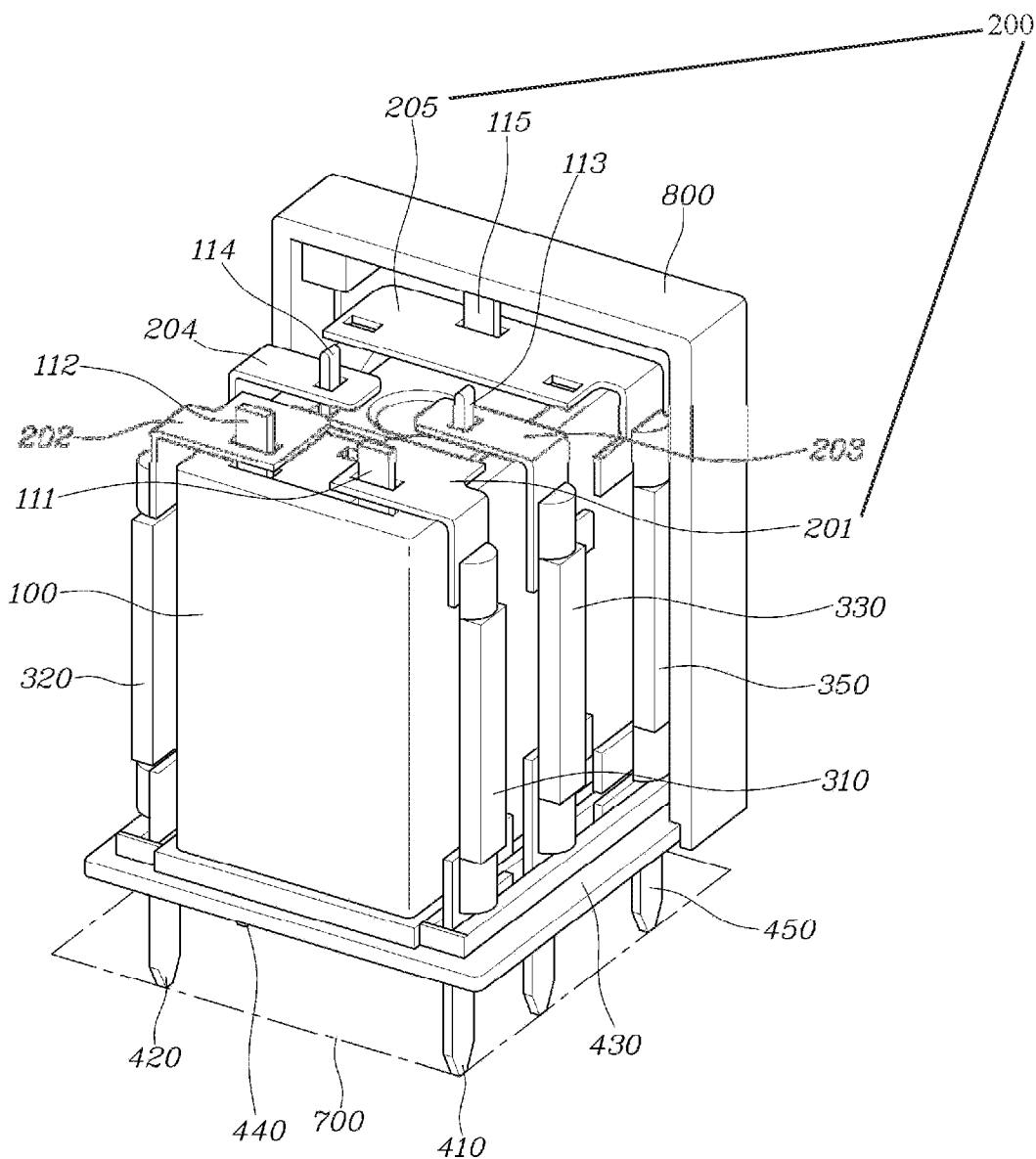
FIG. 1 is a perspective view of a low noise relay according to an embodiment of the present invention.
Figure 2:
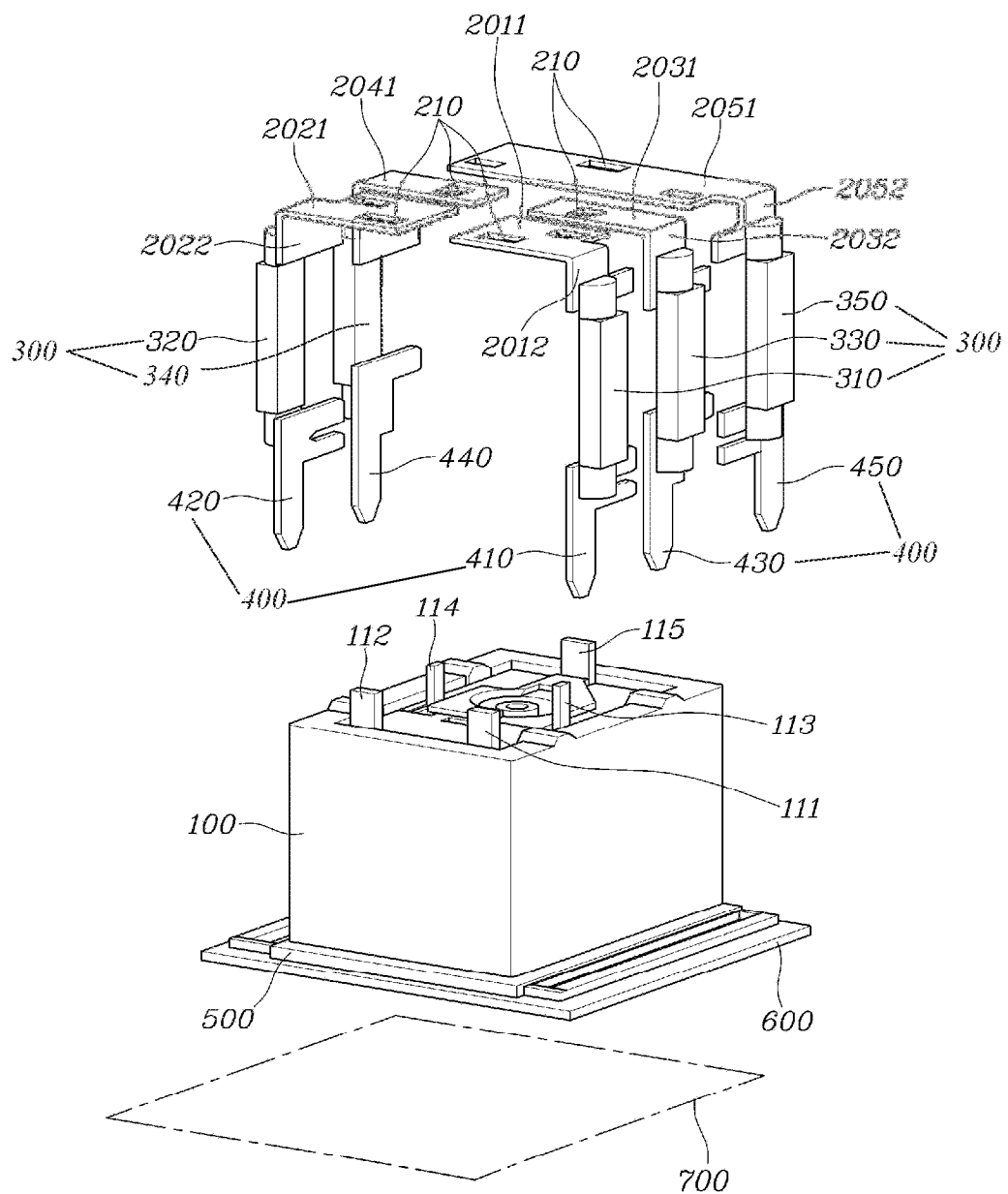
FIG. 2 is an exploded perspective view of the low noise relay according to an embodiment of the present invention.
Figure 3:
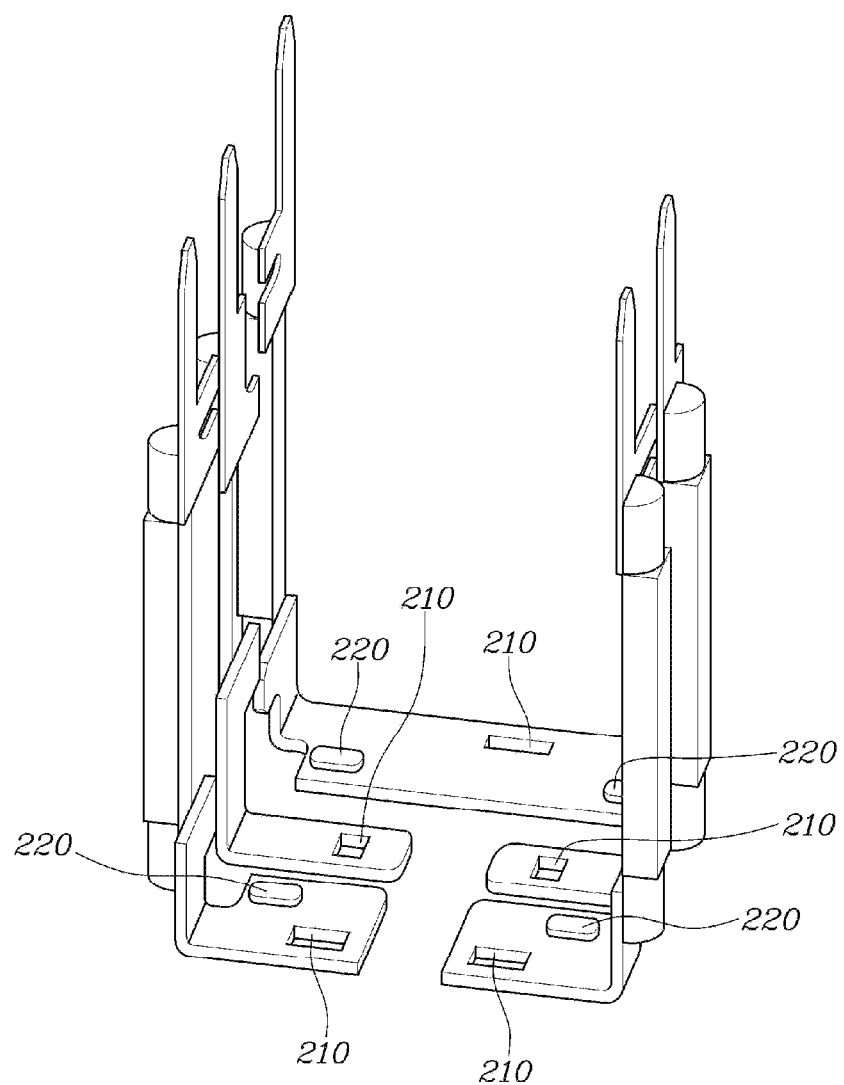
FIG. 3 is a view of a cover part turned upside down in the low noise relay according to an embodiment of the present invention.

FIG. 1 is a perspective view of a low noise relay according to an embodiment of the present invention, FIG. 2 is an exploded perspective view of the low noise relay according to an embodiment of the present invention, and FIG. 3 is a view of a cover part turned upside down in the low noise relay according to an embodiment of the present invention.

As shown in FIGS. 1 and 2, a low noise relay according to an embodiment of the present invention may include a main body part 100, at least one cover part 200, at least one vibration reduction part 300, and at least one pin part 400, and may further include at least one of a shock absorber part 500, a base part 600, and a terminal cover part 800.

Although not specifically shown in the drawing, the main body part 100 has the same configuration as a conventional relay, and may be provided therein with a bobbin, a coil, a movable iron piece, a movable contact, a fixed contact, a leaf spring, etc., and as the coil is energized or de-energized, the internal components of the main body part 100 may operate, resulting in operating noise and vibration. Since it is a well-known technology that the internal components of the main body part 100 operate as the coil is energized or de-energized, a detailed description thereof will be omitted. In order to solve this problem, the present invention improves the structure and shape of the relay so as to reduce the operating noise and vibration generated by the operation of the main body part 100.

Meanwhile, a first surface of the main body part 100 may be provided with at least one terminal 110. Depending on the embodiment, the main body part 100 of the low noise relay according to an embodiment of the present invention may be provided on the first surface thereof with a first terminal 111, a second terminal 112, a third terminal 113, a fourth terminal 114, and a fifth terminal 115 as shown in FIGS. 1 and 2. Here, the terminals 111 to 115 provided on the first surface of the main body part 100 may protrude in a direction opposite to the position of a printed circuit board 700. In addition, the main body part 100 may be provided on an upper surface thereof with a groove 120, and an embossed protruding portion 220 provided on a lower surface of an upper cover part to be described later may be engaged with the groove 120.

The cover part 200 is coupled to the terminal 110 and the first surface of the main body part 100 so that a signal may be transmitted from the main body part 100 via the terminal 110. Depending on the embodiment, the cover part 200 of the low noise relay according to an embodiment of the present invention may include, as shown in FIGS. 1 and 2, a first cover part 201, a second cover part 202, a third cover part 203, a fourth cover part 204, and a fifth cover part 205.

To be specific, the cover part 200 may be made of a conductive material. Depending on the embodiment, the cover part 200 may be made of a copper material. However, this is only an embodiment, so the cover part 200 may be made of other materials of the conductive material. In addition, the cover part 200 may include an upper cover part covering an upper surface of the main body part 100, and a side cover part extending downward from an end of the upper cover part to cover a side surface of the main body part 100. Depending on the embodiment, as shown in FIGS. 1 and 2, when the cover part 200 is constituted by the first cover part 201, the second cover part 202, the third cover part 203, the fourth cover part 204, and the fifth cover part 205, the first cover part 201 may include a first upper cover part 2011 and a first side cover part 2012, the second cover part 202 may include a second upper cover part 2021 and a second side cover part 2022, the third cover part 203 may include a third upper cover part 2031 and a third side cover part 2032, the fourth cover part 204 may include a fourth upper cover part 2041 and a fourth side cover part 2042, and the fifth cover part 205 may include a fifth upper cover part 2051 and a fifth side cover part 2052.

Meanwhile, referring to FIGS. 2 and 3, the upper cover parts 2011, 2021, 2031, 2041, and 2051 may be provided with holes 210 to be engaged with the terminals 111 to 115 of the main body part 100. In addition, the lower surfaces of the upper cover parts may be provided with embossed protruding portions 220. Here, the protruding portion 220 provided on the lower surface of the upper cover part may be engaged with the groove 120 provided on the upper surface of the main body part 100.

To be more specific, it is preferable that the height of the protruding portion 220 is greater than the depth of the groove 120 provided on the upper surface of the main body part 100. In other words, referring to FIG. 1, the upper cover parts 2011, 2021, 2031, 2041, and 2051 may be coupled to the main body part 100 as the holes 210 are engaged with the terminals 111 to 115 of the main body part 100, and may be spaced apart from the upper surface of the main body part 100 by a difference between the height of the protruding portion 220 and the depth of the groove 120 as the protruding portions 220 provided on the lower surfaces of the upper cover parts are engaged with the grooves 120 provided on the upper surface of the main body part 100. Here, the holes 210 of the upper cover parts 2011, 2021, 2031, 2041, and 2051 may be fixed to the terminals 111 to 115 by soldering after insertion.

As described above, the low noise relay according to the present invention is configured such that when the cover part 200 is coupled to the main body part 100, only the embossed protruding portions 220 are engaged with the grooves 120 of the main body part 100 while being spaced apart from the upper surface of the main body part 100 by a predetermined distance, whereby the contact area between the cover part 200 and the main body part 100 can be minimized, thus it is possible to minimize the operating noise and vibration occurring during operation of the main body part 100 from being transmitted to the cover part 200, and as a result, it is possible to minimize the operating noise and vibration occurring during operation of the main body part 100 from being transmitted to the printed circuit board 700 where the relay is assembled.

The vibration reduction part 300 is connected to the cover part 200 so that the signal transmitted from the main body part 100 is transmitted, and supports the main body part 100 to be suspended in the air, thereby reducing the vibration transmitted from the main body part 100. Referring to FIG. 1, in the low noise relay according to an embodiment of the present invention, the main body part 100 is spaced apart from the shock absorber part 500 at a predetermined interval. In other words, the main body part 100 is suspended in the air with the lower surface thereof being spaced apart from the upper surface of the shock absorber part 500 at a predetermined interval, wherein the vibration reduction part 300 connected with the cover part 200 acts as a pillar and can support the main body part 100 to be suspended in the air.

Referring to FIG. 1, depending on the embodiment, the vibration reduction part 300 may include a first vibration reduction part 310, a second vibration reduction part 320, a third vibration reduction part 330, a fourth vibration reduction part 340, and a fifth vibration reduction part 350 connected to the first to fifth cover parts, respectively.

Meanwhile, the vibration reduction part 300 is made of a flexible conductive material, and is configured such that a first side thereof is coupled to the cover part 200 and a second side thereof is coupled to pin parts 410 to 450 to be described later, whereby the signal transmitted from the main body part 100 can be transmitted to the printed circuit board 700. To be more specific, the vibration reduction part 300 may be formed in a flat plate shape by orthogonally crossing wires of flexible conductive material with each other. Depending on the embodiment, the vibration reduction part 300 may be formed in a flat plate shape by orthogonally crossing wires of copper material with each other.

As such, the low noise relay according to an embodiment of the present invention is configured such that the vibration reduction part is made of a flexible material and has a structure in which wires are orthogonally crossed with each other, thereby reducing the vibration transmitted from the main body part.

The shock absorber part 500 is provided between the main body part 100 and the printed circuit board 700, and absorbs the operating noise and vibration of the main body part 100. In addition, as described above, the main body part 100 may be spaced apart from the shock absorber part 500 at a predetermined interval, and the vibration absorber part 500 may support the main body part 100 when the main body part 100 is sagged according to the characteristic of the flexible material of the vibration reduction part 300.

As such, the low noise relay according to an embodiment of the present invention firstly reduces the vibration generated from the main body part through the structure for minimizing the contact area between the cover part and the main body part, secondly reduces the vibration through the vibration reduction part, and thirdly reduces the vibration through the shock absorber part, thereby minimizing the vibration transmitted to the printed circuit board.

The pin part 400 is configured such that a first side thereof is connected with the vibration reduction part 300 and a second side thereof is connected with the printed circuit board 700, whereby the signal transmitted from the main body part 100 can be transmitted to the printed circuit board 700. Referring to FIG. 1, depending on the embodiment, the pin part 400 may include a first pin part 410, a second pin part 420, a third pin part 430, a fourth pin part 440, and a fifth pin part 450 connected to the first to fifth vibration reduction parts, respectively. In the present invention, depending on the embodiment, the main body part 100 and the cover part 200, the cover part 200 and the vibration reduction part 300, and the vibration reduction part 300 and the pin part 400 may be fixed to each other by soldering.

Meanwhile, the low noise relay according to an embodiment of the present invention may further include: the base part 600 disposed at a lower portion of the shock absorber part 500, provided with a hole through which the pin part 400 passes, and coupled to the printed circuit board 700; and the terminal cover part 800 configured to insulate the terminal 110 while covering the terminal 110 provided on the first surface of the main body part 100.

Although the invention is described with reference to specific items such as specific structural elements, to merely some embodiments, and to drawings, such specific details disclosed herein are merely representative for purposes of helping more comprehensive understanding of the present invention. The present invention, however, is not limited to only the example embodiments set forth herein, and those skilled in the art will appreciate that the present invention can be embodied in many alternate forms.

What is claimed is:

1. A low noise relay comprising:
   a main body part provided with a terminal on an upper surface thereof;
   a cover part fixedly coupled to the terminal such that the cover part is spaced apart from the upper surface of the main body part at a predetermined distance, the cover part being electrically connected to the terminal of the main body part;
   a vibration reduction part connected and electrically coupled to the cover part, the vibration reduction part configured to support the main body part to be suspended in the cover part via the terminal in the main body part; and
   a pin part configured such that a first side of the pin part is connected with and electrically connected to the vibration reduction part.

2. The relay of claim 1, wherein the terminal protrudes in a direction opposite to a position of a printed circuit board that is connected to a second side of the pin part.

3. The relay of claim 1, wherein the cover part is made of a conductive material and includes an upper cover part covering the upper surface of the main body part and a side cover part extending downward from an end of the upper cover part to cover a side surface of the main body part.

4. The relay of claim 3, wherein the upper cover part comprises a hole to be engaged with the terminal.

5. The relay of claim 4, wherein the upper cover part is provided with an embossed protruding portion on a lower surface thereof.

6. The relay of claim 5, wherein the main body part is provided with a groove on the upper surface thereof, and the protruding portion of the upper cover part is engaged with the groove.

7. The relay of claim 6, wherein a height of the protruding portion is greater than a depth of the groove.

8. The relay of claim 7, wherein the upper cover part is spaced apart from the upper surface of the main body part by a difference between the height of the protruding portion and the depth of the groove while being coupled to the main body part as the hole is engaged with the terminal.

9. The relay of claim 1, wherein the vibration reduction part is made of a flexible conductive material and is configured such that a first side thereof is coupled to the cover part and a second side thereof is coupled to the pin part.

10. The relay of claim 1, wherein the vibration reduction part is formed in a flat plate shape by orthogonally crossing wires of flexible conductive material with each other.

11. The relay of claim 1, further comprising a terminal cover part configured to insulate the terminal while covering the terminal provided on the upper surface of the main body part.

12. The relay of claim 1, wherein the main body part and the cover part, the cover part and the vibration reduction part, and the vibration reduction part and the pin part are fixed to each other by soldering.

13. The relay of claim 1, further comprising a shock absorber part arranged between the main body part and a printed circuit board that is connected to a second side of the pin part, the shock absorber part configured to absorb operating noise and vibration of the main body part.

14. The relay of claim 13, further comprising a base part disposed at a lower portion of the shock absorber part and coupled to the printed circuit board, the base part being provided with a hole through which the pin part passes.

15. A low noise relay comprising:
   a main body part provided with at least one terminal on an upper surface thereof;
   a cover part fixedly coupled to the terminal such that the cover part is spaced apart from the upper surface of the main body part at a predetermined distance, the cover part configured such that a signal is transmittable from the main body part via the terminal;

a vibration reduction part connected to the cover part such that the signal is transmitted, and configured to support the main body part to be suspended in air the cover part via the terminal of the main body part and to reduce vibration transmitted from the main body part; and a pin part configured such that a first side of the pin part is connected with the vibration reduction part and a second side of the pin part is connected with a printed circuit board, the pin part configured such that the signal is transmittable from the main body part to the printed circuit board.

\* \* \* \* \*

UNITED STATES PATENT AND TRADEMARK OFFICE
CERTIFICATE OF CORRECTION

PATENT NO. : 11,476,069 B2
APPLICATION NO. : 16/601060
DATED : October 18, 2022
INVENTOR(S) : Jong Joo Kim et al.

It is certified that error appears in the above-identified patent and that said Letters Patent is hereby corrected as shown below:

In the Claims

Claim 15, Column 7, Line 5; delete "air".

Signed and Sealed this
Fifteenth Day of November, 2022

Katherine Kelly Vidal
*Director of the United States Patent and Trademark Office*